United States Patent
Van der Poel

(10) Patent No.: US 10,840,695 B2
(45) Date of Patent: Nov. 17, 2020

(54) DEVICE FOR REMOTE DEACTIVATION CONTROL OF AN OVERHEAD LINE

(71) Applicant: Dual Inventive Holding B.V., Oisterwijk (NL)

(72) Inventor: Lex Josephus Maria Van der Poel, Oisterwijk (NL)

(73) Assignee: DUAL INVENTIVE HOLDING B.V., Oisterwijk (NL)

( * ) Notice: Subject to any disclaimer, the term of this patent is extended or adjusted under 35 U.S.C. 154(b) by 175 days.

(21) Appl. No.: 15/869,818

(22) Filed: Jan. 12, 2018

(65) Prior Publication Data
US 2018/0205216 A1 Jul. 19, 2018

(51) Int. Cl.
| | | |
|---|---|---|
| H02H 7/00 | (2006.01) |
| H02H 7/26 | (2006.01) |
| H04L 12/12 | (2006.01) |
| G01R 31/08 | (2020.01) |
| B61L 23/30 | (2006.01) |
| B61L 23/06 | (2006.01) |
| B61L 27/00 | (2006.01) |

(52) U.S. Cl.
CPC ............ *H02H 7/005* (2013.01); *B61L 23/06* (2013.01); *B61L 23/30* (2013.01); *B61L 27/0088* (2013.01); *G01R 31/085* (2013.01); *H02H 7/26* (2013.01); *H04L 12/12* (2013.01); *B61L 2205/02* (2013.01)

(58) Field of Classification Search
CPC .. H02J 13/00; H02B 1/24; H02H 7/00; H02H 7/005; H01H 33/59; B60M 3/00; B60M 3/04
See application file for complete search history.

(56) References Cited

U.S. PATENT DOCUMENTS

| | | | | |
|---|---|---|---|---|
| 2005/0145753 A1* | 7/2005 | Beaman | ................ | B61L 5/067 246/220 |
| 2014/0232191 A1* | 8/2014 | Doelling | ................ | B60M 3/04 307/42 |

FOREIGN PATENT DOCUMENTS

| | | | |
|---|---|---|---|
| CN | 204045750 U | 12/2014 | |
| EP | 1645483 A1 | 4/2006 | |
| GB | 2532009 A * | 5/2016 | ........... H01H 33/596 |
| GB | 2532009 A | 5/2016 | |

(Continued)

*Primary Examiner* — Robert J McCarry, Jr.
(74) *Attorney, Agent, or Firm* — Shumaker, Loop & Kendrick, LLP

(57) ABSTRACT

A device for grounding an overhead line of a segment of rail track including a first electrical conductor configured for connecting electrically to the overhead line of the segment of rail track, a second electrical conductor configured for connecting electrically to ground and/or a return line of the segment of rail track, a switch configured to enable and disable a connection between the first and second electrical conductors, control means configured to activate and deactivate the switch and communication means configured for wireless communication with a remote communication device, for receiving a control signal from the remote communication device and for accordingly actuating the control means for activating and deactivating the switch, or for blocking the switch, wherein the communication means are configured for communication over a public telecommunication network.

11 Claims, 1 Drawing Sheet

(56) References Cited

FOREIGN PATENT DOCUMENTS

NL 9401040 A 2/1996
WO 2013140431 A1 9/2013

* cited by examiner

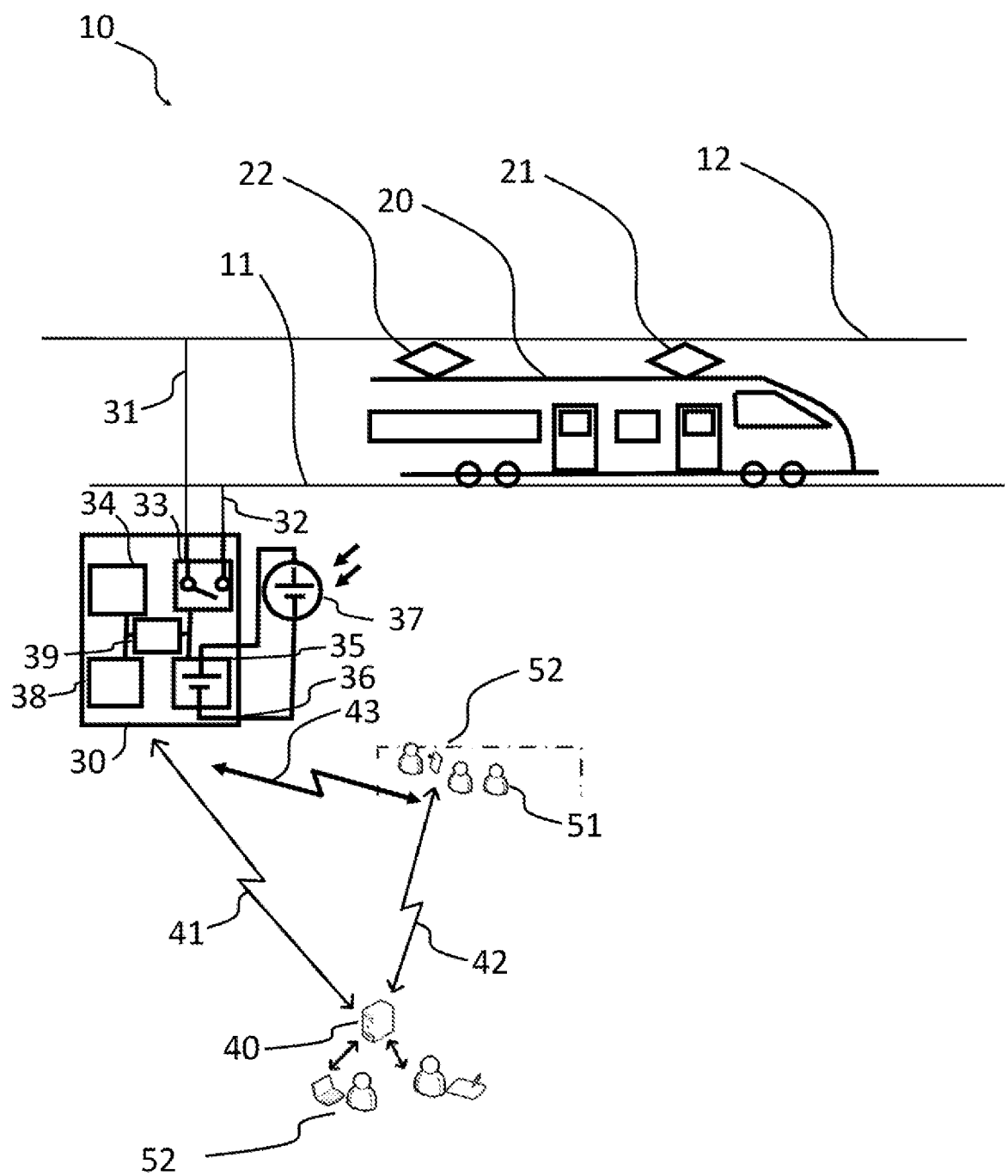

DEVICE FOR REMOTE DEACTIVATION CONTROL OF AN OVERHEAD LINE

TECHNICAL FIELD AND BACKGROUND OF THE INVENTION

The invention relates to a device for the remote deactivation of an overhead line of part of a railway network. The Dutch railway network as well as railway networks in other countries consist of numerous sections of line and rail yards with multiple tracks. Regular maintenance must be performed on this extensive rail network, which carries many passengers.

To ensure the safety of the people who work on the railway, also known as maintenance workers or track workers, or rail workers for short, a particular section of the track is often taken out of service or secured. A single segment, multiple segments or an entire section or block of track may be taken out of service at the same time.

An existing method that has already long been in use to take a track out of service is that of short-circuiting the two rails within a so-called low-frequency track circuit. In this way, each segment of the track in question has a power supply that is connected to a relay through the rails of the track. In an idle state, when no train is present, the voltage between the rails keeps the relay "on". When a train enters the segment, the axles of the train briefly cause a short circuit between the two rails, as a result of which the relay is deactivated and the relevant signal turns red.

In addition to track circuit systems, other systems are also used to take part of the track out of service and to prevent a train from entering that part of the track. The applicant of the present invention therefore provides a device with which those parts (segments) of the track may be removed from service remotely, both by short-circuiting the rails in a part of the track protected by a track circuit system and also by engaging directly with the train safety systems and requesting deactivation in this location, for example by generating/simulating a red signal.

When a part of the track is taken out of service, trains are prohibited from entering that part of the track. In this way, the safety of railway workers performing on-site work (such as regular maintenance work) is regulated with respect to approaching trains.

Nevertheless, the part of the track that has been taken out of service is actually still operational, and so a train could enter the section or segment and ignore the track closure, which is technically possible in principle. For instance, if a track is deactivated without further measures being taken, the overhead line remains live. To protect the railway workers and keep them safe from possible accidents due to electrified components, among other considerations, these components are preferably de-energised before the work is carried out.

In order to prevent the undesirable situation of an un-electrified overhead line being inadvertently re-energised, this overhead line is usually grounded or short-circuited with the return conductor of the circuit before the work commences and after having been de-energised. In practice, with trains, this is normally one of the two rails.

Thus, it is known to electrically connect the unpowered overhead line to one of the rails with the aid of a long short-circuit lance prior to performing the work. In the context of the invention, mention is made of a short-circuit lance, which is often also referred to as a grounding lance or grounding device.

Various disadvantages are associated with the use of this currently known short-circuit lance. For example, the overhead line may not yet have been de-energised at the moment when the railroad worker or safety employee wishes to install the lance. This can pose a safety risk. Currently known short-circuit lances also have the disadvantage that the work (the short-circuiting) is to be performed in an environment that is not yet secure, since the overhead line has not yet been grounded or short-circuited. This also poses a safety risk. A further disadvantage is that currently known short-circuit lances provide little or no information about the status of the short circuit. Some short-circuit lances or short-circuit devices are provided with a test circuit, by means of which the short-circuit lance may perform a self-test to determine whether the lance is working properly. Occasionally, the lance may also be equipped with a test circuit to test the short circuit. It is usually impossible or nearly impossible to determine whether or not the lance has been provided with test circuits of this kind or whether the short circuit has been suspended for some reason. All in all, currently known short-circuit lances of this type are associated with numerous disadvantages that affect not only safety but also the net amount of time the contractor spends working on the track.

There is therefore a need to perform better, safer, faster and more efficient work on the track. More specifically, there is a need to provide means that permit this (at least in part) or that are better in this regard than currently known solutions. Even more in particular, there is a need to provide means for deactivating an overhead line in a safe, robust and flexible manner, thus increasing the net working time of the contractor on the track.

In light of the ever-increasing density of the rail network and the rise in the use of the railway network, the need for rail components that are more reliable, less susceptible to failure, more flexible and maintenance-friendly continues to grow.

BRIEF SUMMARY OF THE INVENTION

The invention seeks to meet the aforementioned need. It is therefore an object of the invention to provide an improved device for short-circuiting an overhead train line.

A further object of the invention is to provide an improved device for short-circuiting an overhead train line that does not have any of the aforementioned disadvantages of currently known short-circuit lances for overhead lines.

Another object of the invention is to provide an improved device for short-circuiting an overhead train line that exhibits at least one of the characteristics more robust, more reliable, less susceptible to failure, safer, more flexible or more maintenance-friendly than currently known short-circuit lances for overhead lines and that preferably ensures more net working time on the track for the contractor. In a first aspect of the invention, the aforementioned object is achieved by a device for grounding an overhead line of a segment of rail track, said device comprising:

a first electrical conductor, which is configured for connecting electrically to the overhead line of the segment of rail track;

a second electrical conductor, which is configured for connecting electrically to ground and/or a return line of the segment of rail track;

a switch, which is configured to enable and disable a connection between the first and second electrical conductors;

control means, which are configured to activate and deactivate the switch; and communication means, which are configured for wireless communication with a remote communication device, for receiving a control signal from the remote communication device and for accordingly actuating the control means for activating and deactivating the switch, and/or for blocking the switch, wherein the communication means are configured for communication over a public telecommunication network.

As was mentioned previously, the railway network is utilised more and more intensively, and the density of the rail network is constantly increasing. Single-track sections are expanded to multiple-track sections, new routes are established and new villages and cities are made accessible.

Track sections are rail segments between two, often relatively large, stations. These track sections may consist of one track but usually comprise multiple tracks. When there are multiple tracks, also known as a multi-track railway, trains travelling in opposite directions occupy their own track, e.g. in the case of a double track. This is in contrast to a single track, where trains are forced to use the same track in both directions.

Apart from single and double tracks, there are also track sections in which three or occasionally four tracks run parallel to each other; at least in the Netherlands, six-track sections also exist in some areas, The track sections can be sub-divided into so-called blocks in accordance with the block system. Only one rail vehicle is allowed to be present in each block, and a section of track normally consists of several interconnected blocks, but in principle a short track section may also contain a single block.

An overhead line is a part of the electrical installation of the rail infrastructure that is used to electrically power the vehicles on the track, namely the trains. The overhead line is the voltage-conducting part here, and one of the rails of the rail line is often used as a return line. Alternatively, the electrical installation may also include a third or fourth rail to conduct the voltage. This approach is not recommended for safety reasons, however, and is therefore not widely used.

The voltage between the return line and the overhead line (or another live line, such as the third or fourth rail) is usually either 700 volts, 1,500 volts, 3,000 volts or even 25,000 volts. This may be direct current (DC) or alternating current (AC). When the return line is provided in the form of rails, it is usually insulated from ground, and the voltage difference between the return line and the ground can be as much as several hundred volts.

The track sections are usually electrically separated from each other, i.e. electrically insulated. Therefore, short-circuiting a voltage-conducting component with a return line by no means ensures that a track can be assumed to be electrically safe for work to be performed. According to the prior art, when an area where work is to be carried out includes a plurality of track sections, each track section must be disconnected separately (de-energised). For each individual track section, the voltage-conducting line has to be short-circuited with the return line in at least one place within the track section. In this way, the voltage-conducting line, e.g. the overhead line, is prevented from short-circuiting with the return line and potentially with the ground if it is still live for any reason. The present invention currently makes reference to the short-circuiting of the voltage-conducting line. This refers to the short-circuiting of the voltage-conducting line with the return line and/or with the ground.

A known means for short-circuiting a voltage-conducting line with the return line is a short-circuit lance (also called short-circuiting or grounding device). This can be installed on-site between the two lines by a track worker.

Various disadvantages are associated with the use of this currently known short-circuit lance, For example, the overhead line may not yet have been de-energised at the moment when the railroad worker or safety employee wishes to install the lance, which may pose a safety risk. Currently known short-circuit lances also have the disadvantage that the work (the short-circuiting) is to be performed in an environment that is not yet secure, since the overhead line may not yet have been grounded or short-circuited. This constitutes a safety risk. Moreover, it reduces the net working time available for carrying out the work; in other words, it increases the gross working time. A further disadvantage is that currently known short-circuit lances provide little or no information about the status of the short circuit. If the short-circuit has been suspended for some reason, it is usually impossible or nearly impossible to determine this.

The device according to a first aspect of the invention does not have these disadvantages and is configured to ground or short-circuit an overhead line of a segment of rail track or a track section. The device comprises a first and a second electrical conductor. The first conductor is configured to establish an electrical connection with the overhead line of the segment of rail track or the track section. The second electrical conductor is configured to establish an electrical connection with the ground and/or a return line of the segment of rail track or the track section, The device further comprises a switch, which is configured to enable and disable, i.e. deactivate a connection between the first and second electrical conductor and control means. The switch may additionally be configured such that it can be blocked. The control means are configured to activate and deactivate the switch and/or to block it. The device is further characterized by the fact that it comprises communication means that are designed for wireless communication with a remote communication device, for receiving a control signal from the remote communication device and for correspondingly actuating the control means to activate and deactivate the switch, respectively, and/or to block it, wherein the communication means are configured for communication over a public telecommunication network.

The device is thus capable of connecting the voltage-conducting line to the return line and/or to the ground and of discontinuing this connection or of blocking or preventing this connection or disconnection based on a command sent from a remote location, such as by the foreman (on-site or at a distance from the track) who is responsible for the work in/for the un-electrified part of the track. This command may be sent wirelessly, e.g. by telephone, tablet or dedicated control device.

The device according to the invention is at least capable of blocking the remote activation or deactivation of the overhead line. This means that a person, in this case the on-site foreman or work manager, can ensure that the overhead line can be activated and/or deactivated only if said person lifts the block on the circuit. If the block instituted by the foreman is active, then the line cannot be switched on remotely by another party. This is possible only once the foreman removes the block. In this way, a system of giving and taking is created. This means that a command to perform activities locally can be prepared centrally by a control centre, such as the Operational Control Centre Infra (giving). This command results in the deactivation of the live overhead line. The contractor or foreman present on-site ensures that it accepts (taking) the command and blocks the deactivation of the overhead line. This block prevents the foreman and his/her colleagues (track workers) from ever being able to work in a section of track where the overhead line can be live, for instance because the control centre has inadvertently switched on the overhead line or rendered it live again. In fact, the switch can be actuated only with the coordinated control of both an on-site manager (the foreman) and a person responsible centrally (the control centre employee or other employee fulfilling this role). This principle of giving and taking can therefore also be carried out from the same location, wherein the process is configured wirelessly by the two responsible parties from a remote location. In this case, it is also possible for those responsible to be two colleagues from the same authority, e.g. neither of whom are present at the control centre but both of whom are located at the track site, or one person at the track site and another colleague located at some distance from the track.

According to the invention, the activation and deactivation may be carried out centrally via wire, but it may also occur wirelessly, with the control preferably being exercised wirelessly on-site. This may be effected by means of a public telecommunication network, such as a 3G, 4G (data) network.

This is significantly different from known short-circuiting means. Those have to be installed on-site at a location that has not yet been rendered completely safe prior to the installation. The present device can already be installed in advance and can thus be activated remotely. Accordingly, a rail worker does not have to enter the track until a time when safety has been ensured. The net working time of the railway worker(s) is thereby increased. On the other hand, the time during which the system is out of service can be reduced, while the working time of the railway worker(s) remains the same.

Since the communication means are configured for communication over a public telecommunication network, and since public telecommunication networks of this type ensure good coverage, stability and speed, communication between a person wishing to establish the short circuit and the device on site is robust. Moreover, this type of communication via a public telecommunication network makes it possible to communicate with the device from any remote location. All that is required is a connection to the remote communication device. In particular, a remote communication device refers to a server. This may be a server that is incorporated into one of the locations that form part of the track, such as a rail house or central command post. Preferably, however, it is a location in a data centre. The server may be a single server but also a plurality of servers in a cluster, or else one or more physical servers and/or one or more virtual servers. A person skilled in the art will understand that multiple possibilities exist for embodiments of the remote communication device.

In one example, the communication means are configured for wireless and wired communication with a remote, preferably wireless, communication device for use near the overhead line that is to be grounded and for communication with the communication device of a central control centre.

The communication means are preferably provided with hardware to communicate with external communication devices both in a wireless and in a wired manner. These external communication devices may be locally present communication devices, such as a dedicated handheld device or a universal tablet, smartphone, laptop or other mobile communication means that is provided with a software application to communicate with the communication means of the grounding device. These external communication devices may also be one or more communication devices of a central control centre, or more specifically an operational control centre for infrastructure. This is preferably wired communication but it can also be carried out wirelessly. More preferably, the communication is carried out redundantly via wired and/or wireless redundant communication means.

In one example, the communication means are configured to receive a control signal from the communication device of the central control centre and to correspondingly actuate the control means only to enable and disable the switch, as well as to receive a control signal from the remote communication device and correspondingly actuate the control means only to block the enabling and disabling of the switch.

Preferably, the control signals from the remote communication device, which is located near the overhead line that is to be grounded, are not identical to the control signals originating from the communication device of the central control centre. Centrally, the switch can be switched only to an on and off position, but locally the switch can be locked or blocked, thereby preventing the switch from being switched on or off.

In one example, the communication means are configured for wired communication, but preferably for wireless communication with the communication means of a central control centre. The communication means are further configured for wired communication, but preferably for wireless communication with the communication means of the remote communication device, for example a tablet used by managers at the track. According to the invention, the central control centre may be a physical central control centre in which, for instance, overhead lines can be switched, faults are reported and assignments for contractors are prepared. In particular, this may be so-called central or local Switching and Reporting Centres (SMC) in the Netherlands, or a central national Operational Control Centre for Infrastructure (OBI). However, the invention is not limited to this arrangement. According to the invention, the central control centre may thus also be understood in such a way that the communication means communicate (by wire, but preferably wirelessly) with a communication device of a person present at the track, or of a colleague at another location, who is not physically present at the central control or in the control centre.

In one example, the switch has three positions, wherein the first position corresponds to interrupting a connection between the first and second electrical conductors, the second position corresponds to preparing to activate a connection between the first and second electrical conductors, and the third position corresponds to actually activating the connection between the first and second electrical conductors.

A practical embodiment comprises a switch with three positions. Position one indicates that the grounding is deactivated; position three indicates that the grounding is activated; and position two prevents or blocks the transition between position one and position three.

In one example, the communication means are configured to actuate the control means so as to turn the switch between the first and the second positions in response to a control signal received by the communication means from the central control centre, and to actuate the control means so as to turn the switch between the second and the third positions in response to a control signal received wirelessly by the communication means from the wireless communication device for use near the overhead line that is to be grounded.

With the aid of the switch according to the example, a control signal is required from both the on-site railway worker(s) and from the central control employee (an employee of the operational control centre for infrastructure, for example). Only once both control signals have been received is the grounding activated or deactivated. Because the switch has three positions, it is possible for the central control employee to prepare or set up an activation or deactivation, but only after the release by the on-site track worker can it actually be performed (the activation or deactivation itself). This ensures an extremely safe workplace for the railway worker(s), reduces the risk of incorrect or undesired activation or deactivation of the grounding and increases the net working time of the railway worker(s).

In the examples described in the present application, the grounding of the overhead line is often discussed by way of example. As was indicated earlier, this is not intended to be an exhaustive explanation. In all examples, grounding is understood to mean the actually electrically connecting with the ground, but this can also or alternatively refer to connecting to a return line of the segment of the rail track.

In one example, the device for grounding an overhead line additionally includes monitoring means configured to monitor the electrical connection between the first and second conductors and to emit an alarm signal to the control means when an active electrical connection is interrupted.

Optionally, the device also comprises verification means for determining whether the short circuit of the voltage-conducting (overhead) Line with the return line has been achieved in a satisfactory manner. If this is not the case, and if low resistance between the two lines cannot be detected, for example, then an alarm signal is transmitted to the control means, which communicates this fact locally and/or remotely to the server.

In one example, the device for the grounding of an overhead line also has a battery, which is configured to power the device. The device preferably has one or more built-in batteries. These may be lithium-ion or lithium-ion-polymer batteries, for example. In one embodiment, the battery may be used to power the communication unit so that it is not dependent on an external power supply from a signal box or the like. It may also be a power supply serving as an auxiliary power supply if the primary power supply from another source is no longer available, such as from a signal box or a switch box next to the track. The power supply provides electricity to at least the communication means/unit, but preferably to all parts of the device.

In one example, the device for grounding an overhead line further comprises a charging unit that is configured to charge the battery, wherein said charging unit is preferably configured to be connected to an external solar panel in order to charge the battery with sunlight.

Providing the device with a charging unit allows the battery to be charged continuously. Preferably, the charging unit also has an external solar panel, which makes it possible to charge the device without external power provided from a fixed network connection.

In one example, the device for grounding an overhead line additionally comprises a charging unit, which is configured to be connected with an external solar panel to charge the battery with sunlight, and in which the housing of the device also includes an integrated solar panel that is connected with the charging unit.

Integrating the solar panel into the housing of the device produces a completely independent unit that no longer requires external power. Alternatively, the solar panel may also be replaced by or additionally provided with other forms of sustainable power supply. An example thereof is an energy-generating device that converts kinetic energy from the movement of the track into electrical energy and transforms this into a voltage suitable for charging the battery. Other possibilities in which magnetic induction is converted into electrical energy by a passing train, for example, are also suitable for charging the battery.

In one example, the communication means of the device for grounding an overhead line are configured for wireless cellular communication over a cellular mobile network, in particular a 2G GSM, 2.5G GPRS or EDGE, 3G UMTS, HSDPA or LTE, 4G LTE Advanced, GSM-R or FRMCS network.

The wireless communication preferably takes place over a cellular mobile network. This may be a conventional UMTS, LTE or LTE Advanced network, but may also be a rail-specific network such as GSM-R or the future FRMCS network or a similar network.

In one example, the communication means of the device for grounding an overhead line are implemented redundantly and are configured to establish at least two simultaneous wireless connections to the remote communication device. In particular, the at least two simultaneous wireless connections are established over different cellular mobile networks.

In the interest of reliability and operational safety, the wireless communication unit is configured to establish a redundant connection. This preferably occurs simultaneously via different networks, preferably via two separate commercial telecommunication networks. This guarantees that control signals as well as commands for activating the switching means to impose or suspend the short circuit are received effectively and can be carried out this at all times.

BRIEF DESCRIPTION OF THE DRAWINGS

The invention will be described in greater detail on the basis of a FIGURE, in which:

FIG. 1 shows a device according to an aspect of the invention.

FIG. 1 shows a schematic view of an embodiment of the device 30 according to the invention illustrated within an element of rail infrastructure 10.

DETAILED DESCRIPTION OF THE INVENTION

The device 30 makes it possible to short-circuit an overhead line 12 of a segment of a rail track (for example, a section of track or several sections of track) with the return line 11. In the example shown, the return line is one of the rails. In practice, for most of the tracks in use, at least in the Netherlands, the overhead line 12 of the track is the voltage-conducting component and one of the rails 11 is used as the return line. Other embodiments are also possible, wherein the voltage component is configured as an extra third or fourth rail, for example, which is located below rather than above the train 20.

The train 20 makes electrical contact with the overhead line 12 by means of a so-called current collector 21, 22, also known as a pantograph. The upper side of the current collector comprises a slider or sliding contact and usually has a carbon component that ensures a good connection with the overhead line. Said component is subject to wear and must be replaced over time.

The train 20 makes electrical contact with the return line 11 by means of the wheels. In so doing, the train completes the electrical circuit between the overhead line 12 and the return line 11.

At times when maintenance is being performed, for example, the live overhead fine is de-energised, primarily in the interest of safety. This may also be done in order to perform a test, for example to check whether an overvoltage protection of the overhead line is still functioning satisfactorily. For this purpose, the device according to the invention has a first electrical conductor 31, which is configured for connecting electrically to the overhead line 12 of the segment of rail track. The device 30 also has a second electrical conductor 32, which is configured for connecting electrically to the ground and/or a return line 11 of the segment of rail track.

The device 30 further comprises a switch 33 or relay or another means for electrically connecting the two conductors 31, 32, and it comprises control means that are configured to activate and deactivate the switch 33. Monitoring means 34 is configured to monitor the electrical connection between the first and second conductors 31, 32 and to emit an alarm signal to the control means 39 when an active electrical connection is interrupted In addition, the device 30 has communication means 38, which are configured for wireless communication 41 with a remote communication device 40 such as a remote server. Thus a control signal or message to actuate the control means 39 in the device 30 can be received from the remote communication device 40. The control means 39 of the device 30 can thereby turn the switch 33 on or off. Communication 41 between the remote server 40 and the device 30 involves a public telecommunication network. With the device 30 according to the invention, it is possible to exercise control by means of commands received from the wireless communication means 38 in the device via every possible means that can communicate with the server 40.

The power for the device 30 is preferably provided by an internal power supply, such as in the form of a battery 35. In practice, this will usually be a plurality of batteries, depending upon the capacity required and the reliability required in the event that one of the batteries or one of the cells of the batteries fails. The batteries are preferably lithium-ion or lithium-ion-polymer batteries, due to their favourable weight/capacity ratio and their ability to provide a high peak current.

The battery preferably has the capacity to power all of the components of the device 30 so that it is completely autonomous. The battery 35 or batteries are preferably rechargeable by means of different connectors, e.g. via an external power connector, via which the battery can be supplied from the signal box or by means of a solar panel 37, or any other external power source. This may be a separate solar panel or power source connected to a charging unit 36. Preferably, however, the solar panel is an integral part of the housing, thereby reducing the likelihood of theft and damage.

The communication unit in the device 30 preferably communicates via a wireless cellular mobile network, such as the 2G GSM, 2.5G GPRS or EDGE, 3G UMTS, HSDPA or LTE, 4G LTE Advanced, GSM-R or FRMCS network 41, 42, 43. There are preferably even multiple connections with the central server 40 at the same time and preferably via different networks. This makes the connection particularly robust. Moreover, it becomes possible both to reliably enable the operation of the short circuit or grounding on-site and/or to check the status thereof, for example by authorising an assignment to on-site railway workers, safety employees or other locally present and authorised persons 51. However, these options may also be made available to people 52 who are not present on-site but remotely monitor 42 the status or who establish, authorise and/or release to (on-site) track workers instructions to activate a short circuit or grounding.

The invention claimed is:

1. A device for grounding an overhead line of a segment of rail track, the device comprising:
   a first electrical conductor configured for connecting electrically to the overhead line of the segment of rail track;
   a second electrical conductor configured for connecting electrically to ground and/or a return line of the segment of rail track;
   a switch configured to enable and disable a connection between the first and second electrical conductors;
   a controller configured to activate and deactivate the switch; and
   a communicator configured for wireless communication with a remote communication device, for receiving a control signal from the remote communication device and for accordingly controlling the controller for activating and deactivating the switch, and for blocking the switch, wherein the communicator is configured for communication over a public telecommunication network, wherein the communicator is configured for wireless communication over the public telecommunication network with the remote wireless communication device for use near the overhead line that is to be earthed and for communication with the communication device of a central control centre, wherein the communicator is further arranged to block the switch from enabling and disabling the connection between the first and second electrical conductors upon receiving a control signal from said remote communication device.

2. The device for grounding an overhead line of a segment of rail track according to claim 1, wherein the communicator is configured for wired and wireless communication with the communicator of the central control centre, and wherein the communicator is further configured for wired and wireless communication with the communication device of the remote communicator.

3. The device for grounding an overhead line of a segment of rail track according to claim 2, further comprising:
   a charging unit configured to be connected with an external solar panel to charge a battery with sunlight, and wherein a housing of the device also-includes an integrated solar panel that is connected with the charging unit.

4. The device for grounding an overhead line of a segment of rail track according to claim 1, wherein the switch has three positions, wherein a first position corresponds to interrupting a connection between the first and second electrical conductors, a second position corresponds to preparing to activate a connection between the first and second electrical conductors, and a third position corresponds to activating the connection between the first and second electrical conductors.

5. The device for grounding an overhead line of a segment of rail track according to claim 4, wherein the communicator is configured to actuate the controller to turn the switch between the first and the second positions in response to a control signal received by the communicator from the central control centre, and to actuate the controller to turn the switch between the second and the third positions in response to a control signal received wirelessly by the communicator from the wireless communication device for use near the overhead line that is to be grounded.

6. The device for grounding an overhead line of a segment of rail track according to claim 1, further comprising:
 a monitor configured to monitor the electrical connection between the first and second conductors and to emit an alarm signal to the controller when an active electrical connection is interrupted.

7. The device for grounding an overhead line of a segment of rail track according to claim 1, further comprising: a battery configured to power the device.

8. The device for grounding an overhead line of a segment of rail track according to claim 1, further comprising:
 a charging unit that is configured to charge a battery, wherein the charging unit is configured to be connected to an external solar panel in order to charge a battery with sunlight.

9. The device for grounding an overhead line of a segment of rail track according to claim 1, wherein the communicator is configured for wireless cellular communication over a cellular mobile network including at least one of a 2G GSM, 2.5G GPRS or EDGE, 3G UMTS, HSDPA or LTE, 4G LTE Advanced, and GSM-R or FRMCS network.

10. The device for grounding an overhead line of a segment of rail track according to claim 1, wherein the communicator is implemented redundantly and is configured to establish at least two simultaneous wireless connections to the remote communication device.

11. The device for grounding an overhead line of a segment of rail track according to claim 10 wherein the at least two simultaneous wireless connections are established over different cellular mobile networks.

\* \* \* \* \*

UNITED STATES PATENT AND TRADEMARK OFFICE
CERTIFICATE OF CORRECTION

Page 1 of 1

PATENT NO. : 10,840,695 B2
APPLICATION NO. : 15/869818
DATED : November 17, 2020
INVENTOR(S) : Lex Josephus Maria Van der Poel It is certified that error appears in the above-identified patent and that said Letters Patent is hereby corrected as shown below:

On the Title Page

Item (54) and in the Specification Column 1, Line 2 should read as follows:
DEVICE FOR THE REMOTE DEACTIVATION OF AN OVERHEAD LINE Please add Item (30) as follows:
January 13, 2017 (NL)............................2018167 and
July 21, 2017 (NL)................................2019317

Signed and Sealed this
Fifth Day of January, 2021

Andrei Iancu
*Director of the United States Patent and Trademark Office*